United States Patent
Ping et al.

(10) Patent No.: US 7,355,232 B2
(45) Date of Patent: *Apr. 8, 2008

(54) MEMORY DEVICES WITH DUAL-SIDED CAPACITORS

(75) Inventors: Er-Xuan Ping, Meridian, ID (US); Shenlin Chen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/218,578

(22) Filed: Sep. 6, 2005

(65) Prior Publication Data

US 2006/0001052 A1   Jan. 5, 2006

Related U.S. Application Data

(60) Continuation of application No. 10/895,130, filed on Jul. 21, 2004, now Pat. No. 7,071,056, which is a continuation of application No. 10/448,115, filed on May 30, 2003, now Pat. No. 6,858,493, which is a division of application No. 10/225,428, filed on Aug. 22, 2002, now Pat. No. 6,870,493.

(51) Int. Cl.
*H01L 27/108* (2006.01)
*H01L 29/76* (2006.01)
*H01L 29/94* (2006.01)
*H01L 31/119* (2006.01)

(52) U.S. Cl. ............... 257/296; 257/303; 257/306; 257/309; 257/E27.086

(58) Field of Classification Search ............... 257/296, 257/300, 301, 303–310, 532, E27.086, E27.087, 257/E27.088
See application file for complete search history.

(56) References Cited

U.S. PATENT DOCUMENTS

| | | | |
|---|---|---|---|
| 5,923,989 A | 7/1999 | Lin et al. | |
| 5,959,326 A | 9/1999 | Aiso et al. | |
| 5,969,983 A * | 10/1999 | Thakur et al. | ............ 365/149 |
| 6,087,694 A | 7/2000 | Ohno et al. | |
| 6,090,679 A | 7/2000 | Lou | |
| 6,174,769 B1 | 1/2001 | Lou | |
| 6,245,633 B1 | 6/2001 | Lou | |
| 6,362,044 B1 | 3/2002 | Shimizu et al. | |
| 6,396,092 B1 * | 5/2002 | Takatani et al. | ............ 257/295 |
| 6,614,093 B2 | 9/2003 | Ott et al. | |

* cited by examiner

Primary Examiner—Hoai V Pham
(74) Attorney, Agent, or Firm—Dickstein Shapiro LLP

(57) ABSTRACT

A dual-sided HSG capacitor and a method of fabrication are disclosed. A thin native oxide layer is formed between a doped polycrystalline layer and a layer of hemispherical grained polysilicon (HSG) as part of a dual-sided lower capacitor electrode. Prior to the dielectric formation, the lower capacitor electrode may be optionally annealed to improve capacitance.

33 Claims, 11 Drawing Sheets

MEMORY DEVICES WITH DUAL-SIDED CAPACITORS

CROSS REFERENCE TO RELATED APPLICATIONS

The present application is a continuation of U.S. application Ser. No. 10/895,130, filed Jul. 21, 2004 (now U.S. Pat. No. 7,071,056), which in turn is a continuation of U.S. application Ser. No. 10/448,115, filed May 30, 2003 (now U.S. Pat. No. 6,858,493, issued Feb. 22, 2005), which in turn is a divisional of U.S. application Ser. No. 10/225,428, filed Aug. 22, 2002 (now U.S. Pat. No. 6,870,493, issued Mar. 22, 2005), the disclosures of which are herewith incorporated by reference in their entirety.

FIELD OF THE INVENTION

The present invention relates to the field of semiconductor integrated circuits and, in particular, to dual-sided capacitors.

BACKGROUND OF THE INVENTION

A dynamic random access memory (DRAM) cell typically comprises a charge storage capacitor coupled to an access device such as a Metal-Oxide-Semiconductor Field Effect Transistor (MOSFET). The MOSFET functions to apply or remove charge on the capacitor, thus affecting a logical state defined by the stored charge. The amount of charge stored on the capacitor is determined by the capacitance $C = \in \in_o A/d$, where $\in$ is the dielectric constant of the capacitor dielectric, $\in_o$ is the vacuum permittivity, A is the electrode (or storage node) area, and d is the interelectrode spacing. The conditions of DRAM operation, such as operating voltage, leakage rate and refresh rate, will in general mandate that a certain minimum charge be stored by the capacitor.

In the continuing trend to higher memory capacity, the packing density of storage cells must increase, yet each must maintain required capacitance levels. This is a crucial demand of DRAM fabrication technologies if future generations of expanded memory array devices are to be successfully manufactured. Nevertheless, in the trend to higher memory capacity, the packing density of cell capacitors has increased at the expense of available cell area. Yet, design and operational parameters determine the minimum charge required for reliable operation of the memory cell despite decreasing cell area.

Several techniques have been developed to increase the capacitance of the cell capacitor without significantly affecting the cell area. For example, capacitor electrodes having textured surface morphology have been introduced to increase the interfacial area between the dielectric thin film and the adjacent electrode and, therefore, to increase the capacitance. For example, in conventional dual-sided (or double-sided) container capacitors, hemispherical grain polysilicon (HSG) has been introduced as the material of choice for the double-sided electrode because the increased surface area of the HSG electrode and of its respective interfacial area is directly proportional to the cell capacitance. However, current technologies for the formation of a double-sided HSG electrode involve using HSG on the outside of the capacitor plate. Accordingly, when two neighboring dual-sided HSG capacitors are fabricated on a DRAM memory circuit, for example, a short circuit between the two dual-sided HSG capacitors may occur and thus, may negatively affect the characteristics of the device.

Accordingly, as memory cell density continues to increase, there is a need for an improved method for forming a dual-sided HSG container capacitor having increased capacitance per cell and low leakage, as well as a method of forming a capacitor structure that achieves high storage capacitance without increasing the size of the capacitor and without a short circuit between the capacitor structure and an additional adjacent capacitor.

SUMMARY OF THE INVENTION

The present invention provides a dual-sided HSG capacitor comprising a native oxide layer as part of a lower electrode, as well as a method of forming a dual-sided HSG capacitor with low leakage and high capacitance and further without a short circuit between the dual-sided HSG capacitor and an additional adjacent capacitor.

The thin native oxide layer is formed between a doped polycrystalline layer and a layer of hemispherical grained polysilicon (HSG) to suppress the diffusion of silicon atoms and dopants from the doped polycrystalline layer into the layer of hemispherical grained polysilicon (HSG) during a seeding and anneal treatment. This way, the formation of large grains of hemispherical grained polysilicon is substantially reduced on the doped polycrystalline layer during the seeding and anneal treatment. Prior to the formation of the thin native oxide layer, the doped polycrystalline layer may be optionally subjected to a cleaning solution. Prior to the dielectric formation, the lower capacitor electrode may be optionally $PH_3$ annealed. A dielectric layer of a high-dielectric constant material, for example of aluminum oxide ($Al_2O_3$) or tantalum oxide ($Ta_2O_5$), and an upper capacitor electrode are fabricated over the lower capacitor electrode.

The present invention also provides a method of forming a dual-sided HSG capacitor with reduced leakage current and high capacitance. A thin native oxide layer is formed as part of a lower electrode over a doped polycrystalline layer, and between the doped polycrystalline layer and a layer of hemispherical grained polysilicon (HSG). The thin native oxide layer may be formed by an ex-situ or an in-situ oxidation process at a low partial pressure, or by an ex-situ wet chemical process. The thin native oxide layer may be also formed by an ex-situ or an in-situ atomic layer deposition (ALD), or by first depositing a silicon layer and then remotely oxidizing the silicon layer. Prior to the formation of the thin native oxide layer, the doped polycrystalline layer may be subjected to a cleaning solution. After its formation and prior to the dielectric formation, the lower capacitor electrode may be optionally subjected to a $PH_3$ anneal treatment to decrease the resistivity of the thin native oxide layer and increase, therefore, the stack capacitance.

A dielectric layer is fabricated over the lower capacitor electrode and after the optional anneal process. The dielectric layer may be formed by either a deposition technique, for example chemical vapor deposition (CVD), or by an atomic layer deposition (ALD) method. An upper electrode of a conductive material is formed over the dielectric layer by a deposition technique, for example chemical vapor deposition (CVD).

The foregoing and other advantages and features of the invention will be better understood from the following detailed description of the invention, which is provided in connection with the accompanying drawings.

BRIEF DESCRIPTION OF THE DRAWINGS

FIG. 18 is a schematic cross-sectional view of the FIG. 1 device at a stage of processing subsequent to that shown in FIG. 17.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that various structural, logical, and electrical changes may be made without departing from the spirit or scope of the invention.

The term "substrate" used in the following description may include any semiconductor-based structure that has a silicon surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor also need not be silicon-based. The semiconductor could be silicon-germanium, germanium, or gaillium arsenide. When reference is made to a substrate in the following description, previous process steps may have been utilized to form regions or junctions in or on the base semiconductor or foundation.

Figure 1:
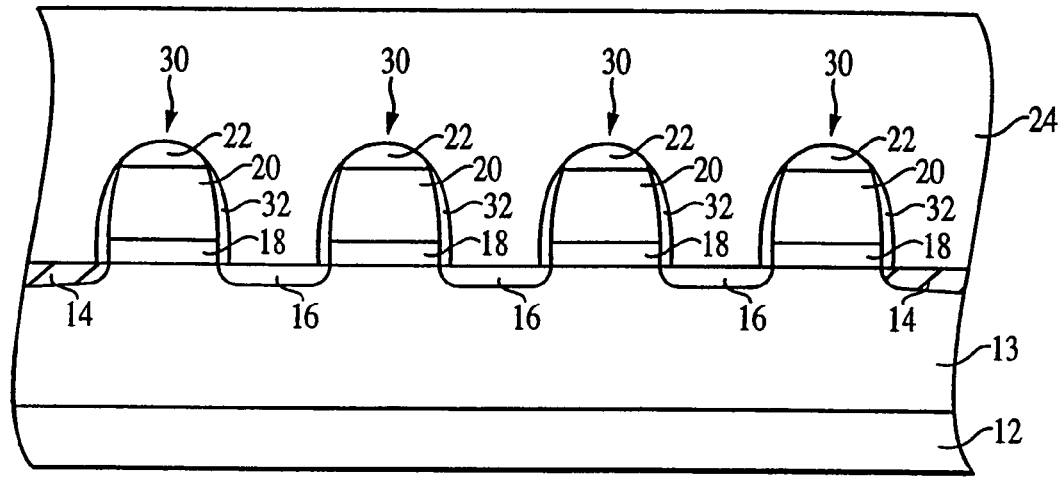
FIG. 1 is a schematic cross-sectional view of a portion of a memory DRAM device, in which a dual-sided HSG capacitor will be fabricated according to a method of the present invention.

Referring now to the drawings, where like elements are designated by like reference numerals, FIG. 1 depicts a memory cell construction for a DRAM at an intermediate stage of the fabrication, in which a pair of memory cells having respective access transistors are formed on a substrate 12. The FIG. 1 structure includes the substrate 12 having a well 13, which is typically doped to a predetermined conductivity, for example p-type or n-type depending on whether NMOS or PMOS transistors will be formed therein. The structure further includes field oxide regions 14, conventional doped active areas 16 for use as source/drain regions, and gate stacks 30, all formed according to well-known semiconductor processing techniques. The gate stacks 30 include a gate oxide layer 18, a conductive gate layer 20, such as polysilicon or polysilicon covered by a silicide, nitride spacers 32 and a nitride cap 22.

Above the gate oxide region 18, the polysilicon gates 20, and the protective nitride regions 22, 32, a first insulating layer 24 (FIG. 1) is disposed. Insulating layer 24 could be formed of silicon oxide, borophosphosilicate glass (BPSG), borosilicate glass (BSG), or phosphosilicate glass (PSG), among others.

Figure 2:
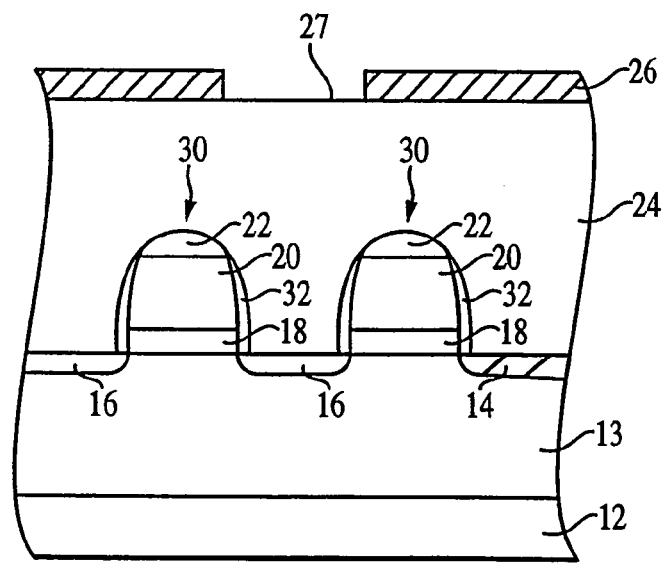
FIG. 2 is a schematic cross-sectional view of the FIG. 1 device at a stage of processing subsequent to that shown in FIG. 1.
Figure 3:
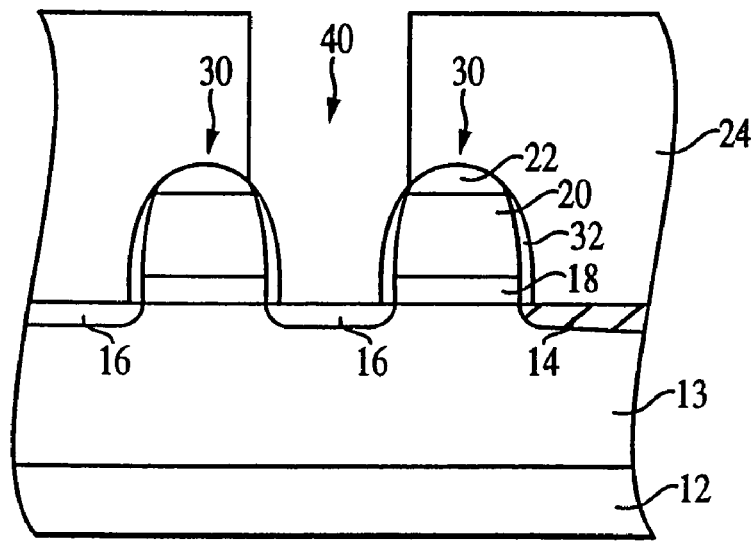
FIG. 3 is a schematic cross-sectional view of the FIG. 1 device at a stage of processing subsequent to that shown in FIG. 2.

Reference is now made to FIG. 2, which for simplicity illustrates only a lateral portion, for example, the right side portion of FIG. 1. This is a region where a contact plug and an overlying dual-sided HSG capacitor structure 100 (FIG. 16) fabricated according to exemplary embodiments of the present invention will be formed. To create a contact opening 40 (FIG. 3) into the substrate 12 through the first insulating layer 24, a photoresist material 26 (FIG. 2) is deposited and patterned using conventional photolithography steps. After patterning, an initial opening 27 (FIG. 2) is formed in the photoresist layer 26 for subsequent oxide etching. The first insulating layer 24 of FIG. 2 is then etched, to form a contact opening 40, and the photoresist layer 26 is removed, as shown in FIG. 3. The contact opening 40 extends to the source/drain region 16 provided in the well 13 of the substrate 12.

Figure 4:
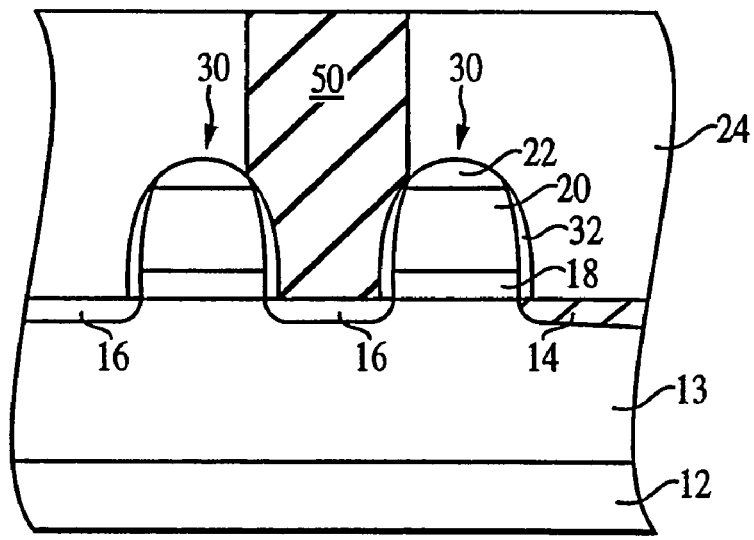
FIG. 4 is a schematic cross-sectional view of the FIG. 1 device at a stage of processing subsequent to that shown in FIG. 3.
Figure 5:
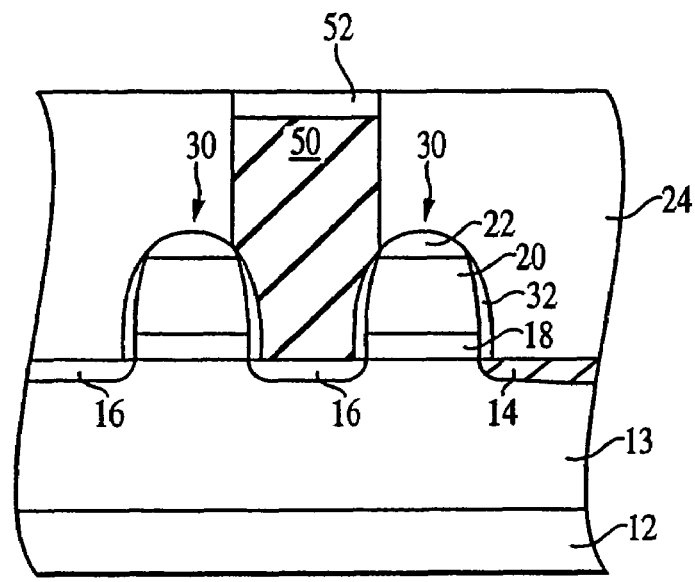
FIG. 5 is a schematic cross-sectional view of the FIG. 1 device at a stage of processing subsequent to that shown in FIG. 4.

Next, contact opening 40 (FIG. 3) is filled with a conductive material, such as doped polysilicon, that is planarized down to or near the planar surface of the first insulating layer 24, to form a polysilicon plug or filler 50, as illustrated in FIG. 4. The polysilicon plug 50 is then anisotropically etched until its top surface is recessed below the planar surface of the first insulating layer 24, so that a metal layer 52 (FIG. 5) can be deposited and planarized, as shown in FIG. 5. The metal layer 52, which may be of titanium (Ti), for example, is formed on the polysilicon plug 50 by CVD, PVD, sputtering or evaporation, to a thickness of about 60 to about 200 Angstroms. If titanium is employed, then the metal layer 52 will form a metal silicide, for example titanium silicide ($TiSi_2$), during a later high temperature anneal. Although the present invention is described with reference to the formation of a dual-sided HSG capacitor 100 (FIG. 17) over the polysilicon plug 50, including the metal layer 52, it must be understood that the existence of the metal layer 52 is optional, and that the present invention also applies to capacitors formed over polysilicon plugs without protective metal layer 52.

Figure 6:
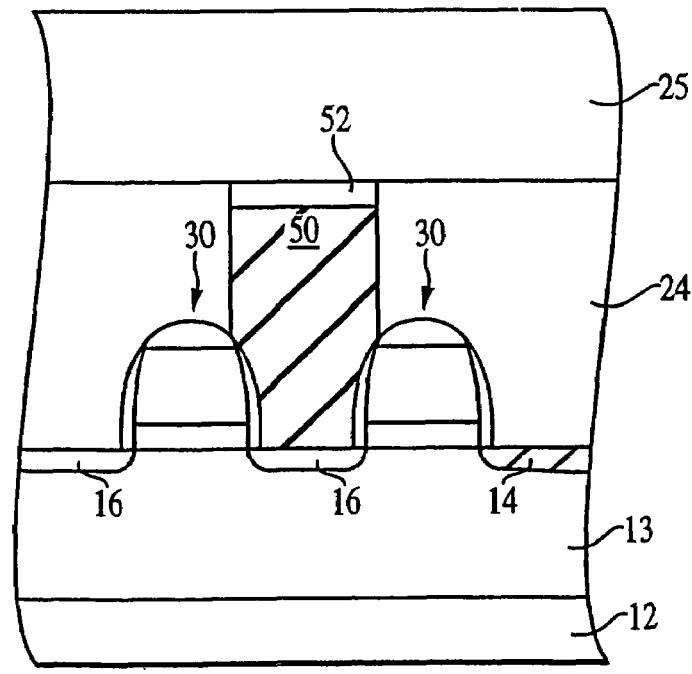
FIG. 6 is a schematic cross-sectional view of the FIG. 1 device at a stage of processing subsequent to that shown in FIG. 5.

FIG. 6 illustrates the deposition of a second insulating layer 25, which could be, for example, a silicon oxide, borophosphosilicate glass (BPSG), borosilicate glass (BSG), phosphosilicate glass (PSG), or tetraethylortho silicate (TEOS). The second insulating layer 25 is deposited over the barrier layer 52 and the first insulating layer 24. Again, using the same fabrication technique as that used for the formation of contact opening 40 (FIG. 3) through the first insulating layer 24, a capacitor opening 41 (FIG. 7) is formed through the second insulating layer 25.

Figure 7:
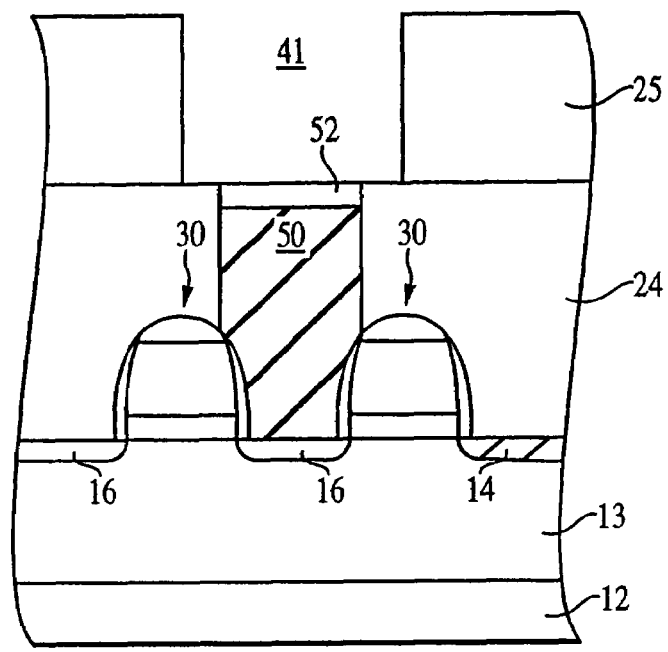
FIG. 7 is a schematic cross-sectional view of the FIG. 1 device at a stage of processing subsequent to that shown in FIG. 6.
Figure 8:
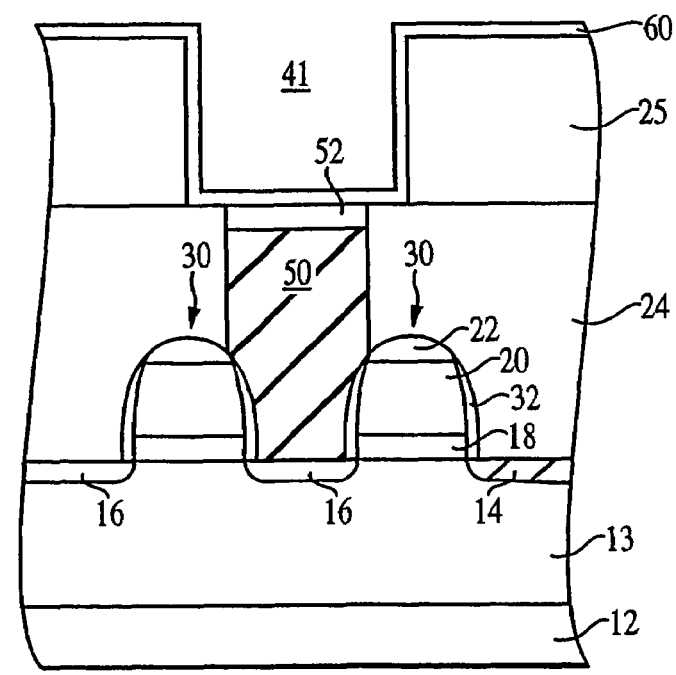
FIG. 8 is a schematic cross-sectional view of the FIG. 1 device at a stage of processing subsequent to that shown in FIG. 7.

Subsequent to the formation of capacitor opening 41 of FIG. 7, a doped polycrystalline layer 60 is formed inside the capacitor opening 41 and over the upper surface of the second insulating layer 25, as illustrated in FIG. 8. The doped polycrystalline layer 60 may be formed of hemispherical grained polysilicon (HSG), silicon, germanium, or any alloy of silicon or germanium to increase capacitance. Preferably, the doped polycrystalline layer 60 is formed of hemispherical grained polysilicon (HSG). If HSG is used, the doped polycrystalline layer 60 may be formed to a thickness of about 50 Angstroms to about 200 Angstroms by depositing a layer of in-situ doped polysilicon. Alternatively, the doped polycrystalline layer 60 may be provided by in-situ arsenic doping of an entire HSG layer. The doped polycrystalline layer 60 is in electrical contact with the previously formed conductive plug 50 over the active area 16. For simplicity, the doped polycrystalline layer 60 will be referred to hereinafter as doped polysilicon layer 60.

According to an embodiment of the present invention, if the doped polysilicon layer 60 is formed of HSG, the doped polysilicon layer 60 may be further subjected to a cleaning solution, for example, a dilute solution of hydrofluoric acid (HF) with a 10:1 volumetric ratio of water to 49% HF, to remove any impurities and/or residue formed over the doped polycrystalline layer 60.

Figure 9:
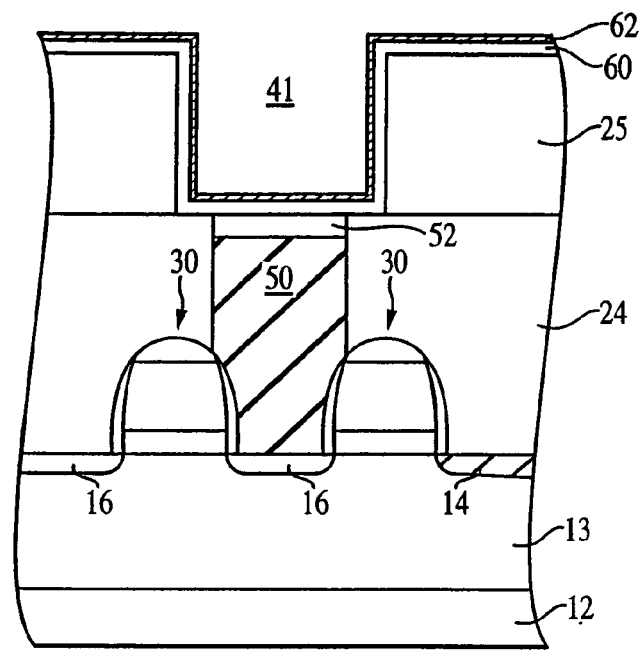
FIG. 9 is a schematic cross-sectional view of the FIG. 1 device at a stage of processing subsequent to that shown in FIG. 8.

Referring now to FIG. 9, a thin native oxide layer 62 is formed over the doped polysilicon layer 60 to a thickness of about 5 Angstroms to about 50 Angstroms. The thin native oxide layer 62 may be formed by various methods, for example, ex-situ or in-situ thermal processing, ex-situ wet chemical processing, or ex-situ or in-situ atomic layer deposition (ALD), among others.

For example, and in accordance with an embodiment of the present invention, the thin native oxide layer 62 may be formed by an in-situ oxidation of the doped polysilicon material forming the doped polysilicon layer 60. This way, oxygen ($O_2$) may be bled over the doped polysilicon layer 60 at a low partial pressure, of about $10^{-6}$ Torr, and for about 1-5 minutes, to form the thin native oxide layer 62 of FIG. 9. Those skilled in the art would realize that increasing the partial pressure of the low pressure oxidation process will proportionately decrease the oxidation time.

According to another embodiment of the present invention, the thin native oxide layer 62 may be formed by first depositing a thin doped silicon layer over the doped polysilicon layer 60 and subsequently oxidizing the thin doped silicon layer to form the thin native oxide layer 62 (FIG. 9). For example, a dopes silicon layer with a thickness of about 5 Angstroms to about 50 Angstroms may be first formed over the doped polysilicon layer 60, by a chemical vapor deposition process, for example, in a first processing chamber. Subsequent to the deposition of the doped silicon layer, the substrate 12 is removed from the first processing chamber to a second processing chamber in which oxidation of the doped silicon layer may take place under an ozone ($O_3$) treatment, for example, for about 2 minutes to about 2 hours, to form the thin native oxide layer 62.

According to yet another embodiment of the present invention, the thin native oxide layer 62 may be grown, for example, at a temperature of about 25° C. (room temperature) to about 1100° C., preferably at a temperature less than about 900° C., for about 1 second to about 10 minutes, using a gas ambient containing atomic oxygen. The atomic oxygen can be supplied by in-situ steam generation. In other words, a combination of $O_2$ and $H_2$ at a hot wafer surface, or a surface in close proximity, is utilized wherein steam and atomic oxygen is formed and available for oxidation. Also, atomic oxygen can be supplied by an ozone source, plasma source, microwave source or photoexcitation.

The thin native oxide layer 62 may be also formed by an ex-situ or an in-situ atomic layer deposition (ALD) process. According to the ALD embodiment, a first species of silicon precursor, such as an silicon source precursor, for example silane or a multiple-order silane such as di-silane or tri-silane, is first deposited over the surface of the doped polysilicon layer 60 (FIG. 8) as a first monolayer. A second species of oxygen precursor, which may be an oxygen ($O_2$) or an ozone ($O_3$) source, or water ($H_2O$) for example, is next applied over the monolayer of the first species of precursor. The second species of precursor reacts with the monolayer of the first species of precursor to form a silicon oxide layer. The sequence of depositing the monolayers of the first and second species of precursors is repeated cycle after cycle and as often as needed, until the thickness for the thin native oxide layer 62 (FIG. 9) is of about 5 Angstroms to about 50 Angstroms.

Figure 10:
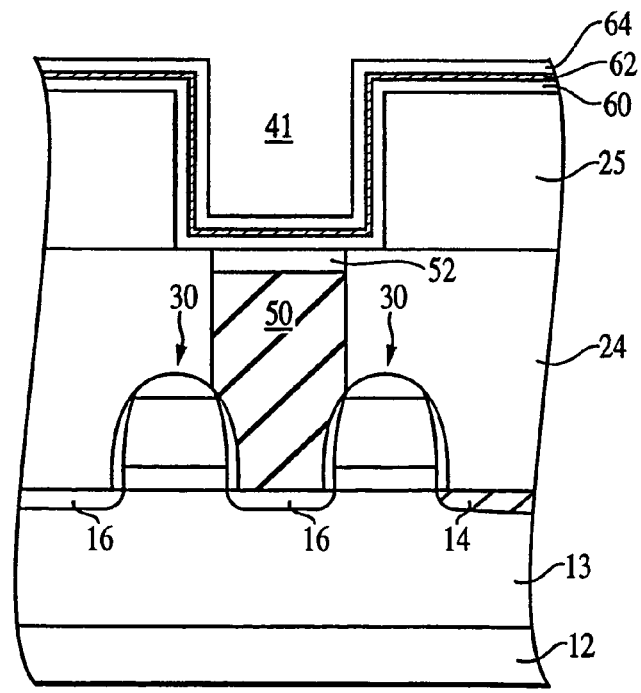
FIG. 10 is a schematic cross-sectional view of the FIG. 1 device at a stage of processing subsequent to that shown in FIG. 9.

Reference is now made to FIG. 10. After the formation of the thin native oxide layer 62, an amorphous undoped silicon layer 64 is subsequently formed over the thin native oxide layer 62 to a thickness of about 100 Angstroms to about 300 Angstroms. The amorphous undoped silicon layer 64 may be formed, for example, by depositing amorphous silicon by a chemical vapor deposition process (CVD) or by plasma enhanced chemical vapor deposition (PECVD).

Figure 11:
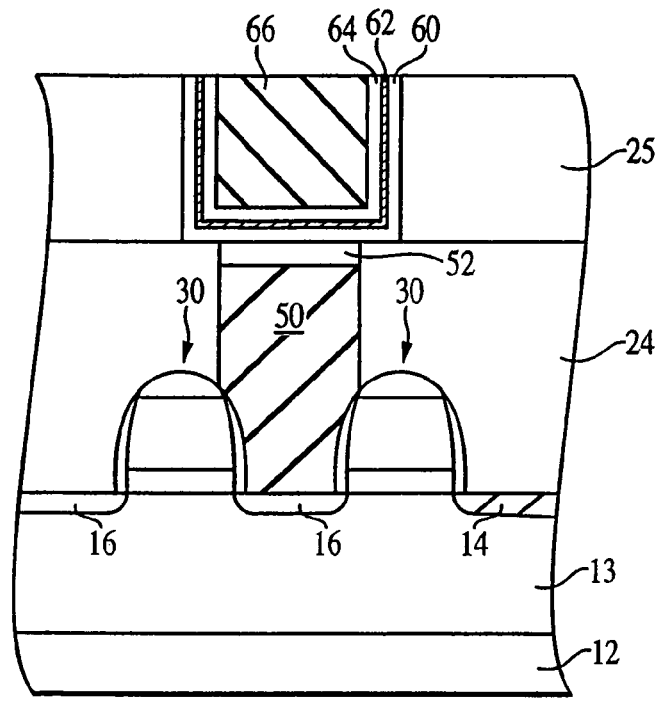
FIG. 11 is a schematic cross-sectional view of the FIG. 1 device at a stage of processing subsequent to that shown in FIG. 10.

After the formation of the amorphous undoped silicon layer 64, the capacitor opening 41 (FIG. 10) is next filled with a photoresist material (not shown) by, for example, spin coating at room temperature and then solidifying it. The photoresist material can be any photochemical resin used in the semiconductor industry. Thereafter, the photoresist material and the horizontal portions of the doped polysilicon layer 60, the thin native oxide layer 62 and the amorphous undoped silicon layer 64 located above the second insulating layer 25, are planarized by CMP down to or near the planar surface of the upper surface of the second insulating layer 25 to form a photoresist plug 66 (FIG. 11).

Figure 12:
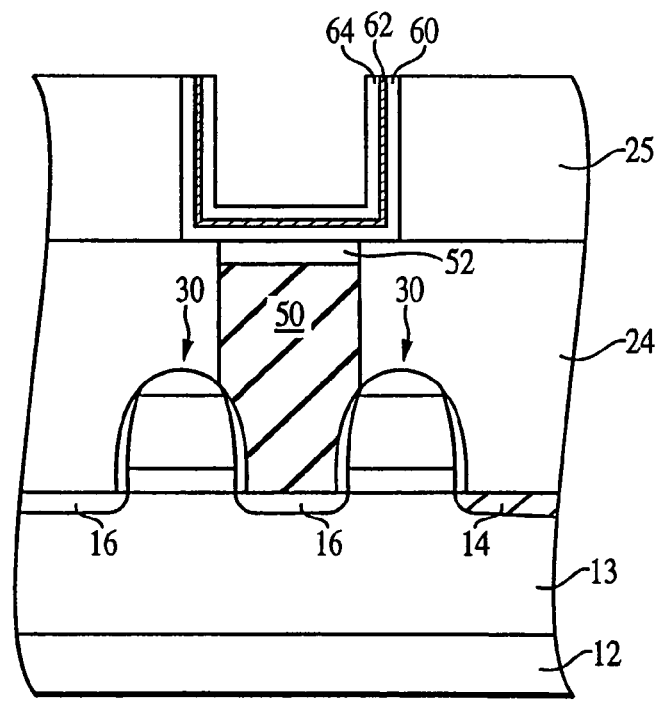
FIG. 12 is a schematic cross-sectional view of the FIG. 1 device at a stage of processing subsequent to that shown in FIG. 11.

Next, the CMP polished photoresist plug 66 (FIG. 11) is removed using conventional techniques, such as ashing or plasma etching, to form the structure of FIG. 12. This way, the portions of the doped polysilicon layer 60, of the thin native oxide layer 62 and of the undoped silicon layer 64 remaining inside the capacitor opening 41 are electrically isolated. Upon removal of the photoresist plug 66, the undoped silicon layer 64 may be optionally cleaned with a dilute etching solution, for example, a dilute solution of hydrofluoric acid (HF) having a 10:1 volumetric ratio of water to 49% HF, to remove any impurities and/or material residue present on the undoped silicon layer 64.

Figure 13:
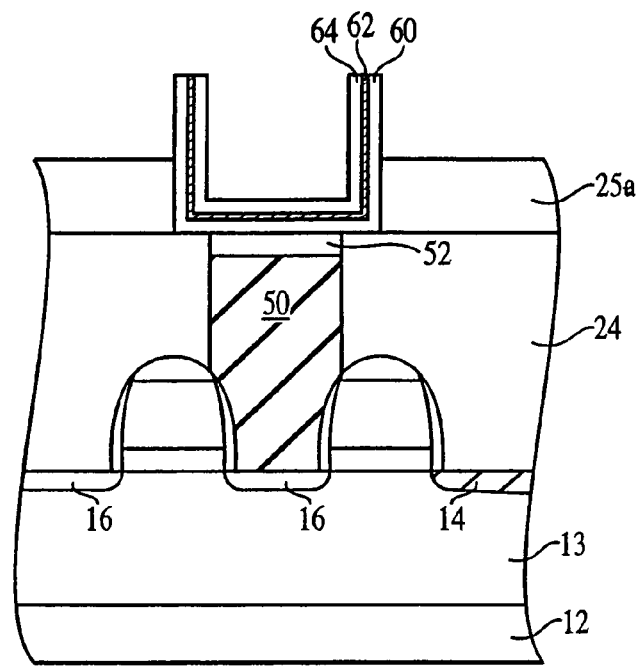
FIG. 13 is a schematic cross-sectional view of the FIG. 1 device at a stage of processing subsequent to that shown in FIG. 12.

Referring now to FIG. 13, portions of the second insulating layer 25 are etched back around the doped polysilicon layer 60 to expose at least a portion of the doped polysilicon layer 60. The portions of the second insulating layer 25 are preferably removed by employing an etchant containing a dilute solution of hydrofluoric acid (HF), such as a 10:1 volumetric ratio of water to 49% HF solution; however, the invention is not limited to this particular etchant and any method of exposing the doped polysilicon layer 60 or of removing portions of the second insulating layer 25 from around the doped polysilicon layer 60 is within the scope of the present invention. Although FIG. 13 illustrates remaining portions 25a of the second insulating layer 25, the present invention is not limited to this embodiment. Accordingly, the present invention also contemplates the removal of the whole second insulating layer 25 to completely expose the doped polysilicon layer 60.

Subsequent to the exposure of at least a portion of the doped polysilicon layer 60, the amorphous undoped silicon layer 64 is subjected to a seeding and anneal treatment. Accordingly, silicon nuclei which will eventually form hemispherical grains are selectively seeded within the amorphous undoped silicon layer 64. The seeding can take place by employing a silicon source such as silane ($SiH_4$) or di-silane ($SiH_6$), for example, for about 1-2 minutes in a high vacuum, at a pressure of about $10^{-5}$ Torr to about $10^{-8}$ Torr, and at a temperature of about 600° C. to about 700° C.

Figure 14:
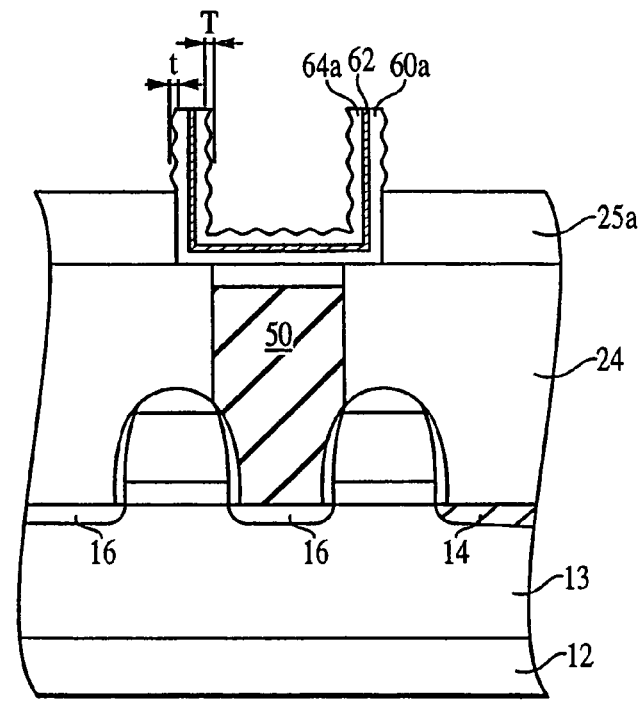
FIG. 14 is a schematic cross-sectional view of the FIG. 1 device at a stage of processing subsequent to that shown in FIG. 13.

Subsequent to the selective seeding process, the silicon source is removed and the amorphous undoped silicon layer 64 comprising the seeded nuclei is further subjected to an anneal treatment. This way, under a high temperature of about 600° C. to about 700° C., silicon atoms from the amorphous undoped silicon layer 64 migrate towards the seeded nuclei to form a hemispherical grained (HSG) polysilicon layer 64a having large hemispherical grains, as illustrated in FIG. 14. The large hemispherical grains of the hemispherical grained (HSG) polysilicon layer 64a are formed to a thickness "T" (FIG. 14) of about 100 Angstroms to about 500 Angstroms.

During the formation of the hemispherical grained (HSG) polysilicon layer 64a and as a result of the heat treatment, a thermally annealed doped polysilicon layer 60a (FIG. 14) is also formed at the exposed portion of the doped polysilicon layer 60. The annealed doped polysilicon layer 60a comprises small HSG grains which are formed as a result of the diffusivity of silicon atoms and seeded nuclei from the amorphous undoped silicon layer 64 and into the doped polysilicon layer 60. However, the presence of the thin native oxide 62 between the amorphous undoped silicon layer 64 and the doped polysilicon layer 60 significantly reduces the diffusivity of such silicon atoms and seeded nuclei during the anneal treatment. Thus, as a result of the presence of the thin native oxide 62, the HSG grains that form on the exposed portion of the doped polysilicon layer 60 are very small. The small HSG grains of the annealed doped polysilicon layer 60a have a thickness "t" (FIG. 14) of only few Angstroms, for example, about 10 Angstroms to about 50 Angstroms. In any event, the thickness "t" of the small HSG grains formed on the annealed doped polysilicon layer 60a mitigates against capacitor-to-capacitor shorts when dual-sided HSG capacitors are formed adjacent one another.

According to an embodiment of the present invention and to further improve the stack capacitance, the hemispherical grained (HSG) polysilicon layer 64a (FIG. 14) and the thermally annealed doped polysilicon layer 60a (FIG. 14) may be optionally subjected to a further anneal treatment, such as an in-situ $PH_3$ anneal at about 750° C. and for about 30 minutes. A nitrogen ($N_2$) or ammonia ($NH_3$) plasma anneal, or any other nitrogen source plasma anneal, may be also employed along with the $PH_3$ anneal for doping with phosphorous atoms (from the $PH_3$ source) the hemispherical grained (HSG) polysilicon layer 64a and the doped polysilicon layer 60. This way, as a result of the $PH_3$ anneal, the thin native oxide layer 62 formed between the hemispherical grained (HSG) polysilicon layer 64a and the doped polysilicon layer 60 is also doped with phosphorous atoms from the phosphate source. The dopant atoms reduce the resistivity of the native oxide and, as a result, the doped thin native oxide layer 62 forms an ohmic contact and increases the overall cell capacitance.

According to another embodiment of the present invention and to further improve the capacitance and decrease the leakage, a cleaning step may be performed before the $PH_3$ anneal treatment described above. For example, a dilute cleaning solution such as a dilute hydrofluoric acid (HF) solution having a 10:1 volumetric ratio of water to 49% HF may be used to clean the hemispherical grained (HSG) polysilicon layer 64a before the in-situ $PH_3$ anneal.

Figure 15:
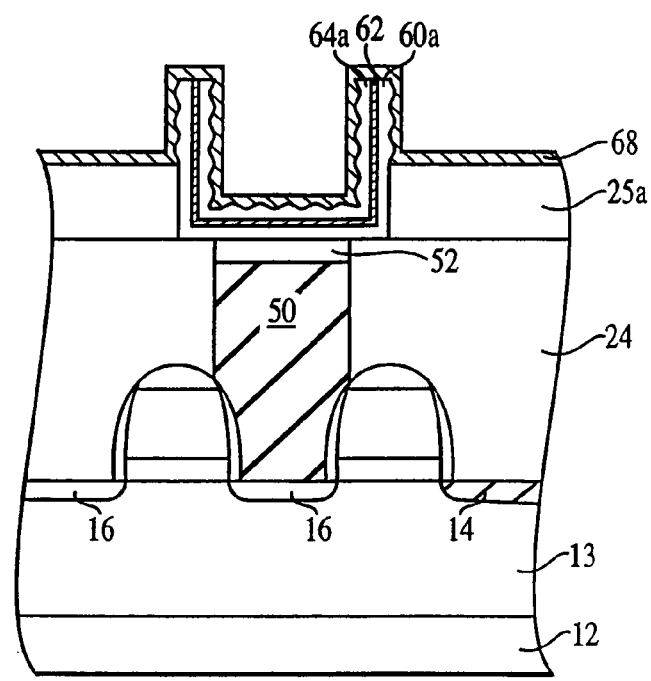
FIG. 15 is a schematic cross-sectional view of the FIG. 1 device at a stage of processing subsequent to that shown in FIG. 14.

Next, a dielectric layer 68 is formed over the structure of FIG. 14 and the top surface of the second insulating layer 25, as illustrated in FIG. 15. The dielectric layer 68 may be formed of a high-dielectric constant (of about 300 or higher) material such as $Ta_2O$ (tantalum pentoxide), Barium Titanate (BT), Strontium Titanate (ST), Lead Zirconium Titanate (PZT), or Bismuth Strontium Titanate (BST), among others. The dielectric layer 68 (FIG. 15) may be also formed of aluminum oxide ($Al_2O_3$), zirconium oxide ($ZrO_2$), hafnium oxide (HfO), a hafnium-aluminum-oxygen alloy (Hf—Al—O), or a lanthanum-aluminum-oxygen alloy (La—Al—O), among others. The dielectric layer 68 may be formed by a deposition technique, for example, such as chemical vapor deposition (CVD), metalorganic chemical vapor deposition (MOCVD) or sputtering, or by atomic layer deposition (ALD), among others, to a thickness of about 20 Angstroms to about 100 Angstroms.

Figure 16:
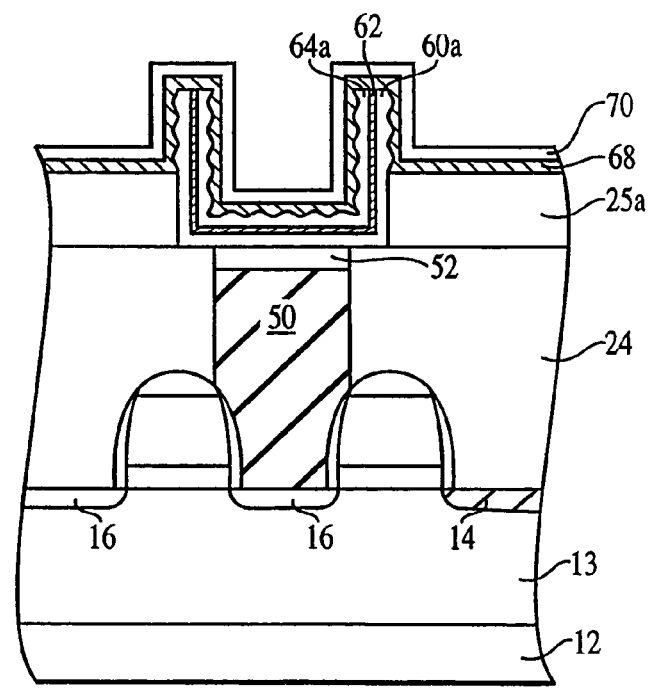
FIG. 16 is a schematic cross-sectional view of the FIG. 1 device at a stage of processing subsequent to that shown in FIG. 15.

Subsequent to the formation of the dielectric layer 68 (FIG. 15), an upper capacitor electrode 70 of a conductive material is formed over the dielectric layer 68, as illustrated in FIG. 16. The upper capacitor electrode 70 is formed to a thickness of about 50 Angstroms to about 250 Angstroms. According to an embodiment of the present invention, the upper capacitor electrode 70 may be formed of a noble metal, noble metal alloys, or conductive noble metal oxides, such as ruthenium oxide or osmium oxide, among others.

The upper capacitor electrode 70 (FIG. 16) may be formed of a metal nitride, for example titanium nitride or tungsten nitride, among others. According to this exemplary embodiment, the metal nitride upper electrode 70 may be formed, for example, by a chemical vapor deposition (CVD) process using a metal source and a nitrogen source as precursors, at a temperature of about 500° C. to about 800°

C., more preferably of about 600° C. For example, if a titanium nitride electrode is desired, the titanium nitride upper capacitor electrode 70 may be forihed using a nitrogen source, such as an ammonia ($NH_3$) source, and a titanium source precursor containing chlorine (Cl), such as $TiCl_4$ (titanium tetrachloride), $TiCl_3$ (titanium trichloride), $(C_5H_5)_2TiCl_2$ [bis(cyclopentadienyl)titanium dichloride] or $(C_5H_5)TiCl_3$ (cyclopentadienyltitanium trichloride), among others.

Alternatively, the titanium nitride upper capacitor electrode 70 (FIG. 16) may be formed by a low-temperature chemical vapor deposition (CVD) process by adding $(CH_3)HNNH_2$ (methylhydrazine) to a titanium source containing chlorine (Cl), for example $TiCl_4$ (titanium tetrachloride). A metalorganic precursor such as $TiN[CH_2(CH_3)_2]_4$ (tetraiis diethylamino titanium or TDEAT) or $Ti[N(CH_3)_2]_4$ (tetrakis dimethylamino titanium or TDMAT) may be also used with a nitrogen source precursor to form the titanium nitride upper electrode 70 of FIG. 16.

Figure 17:
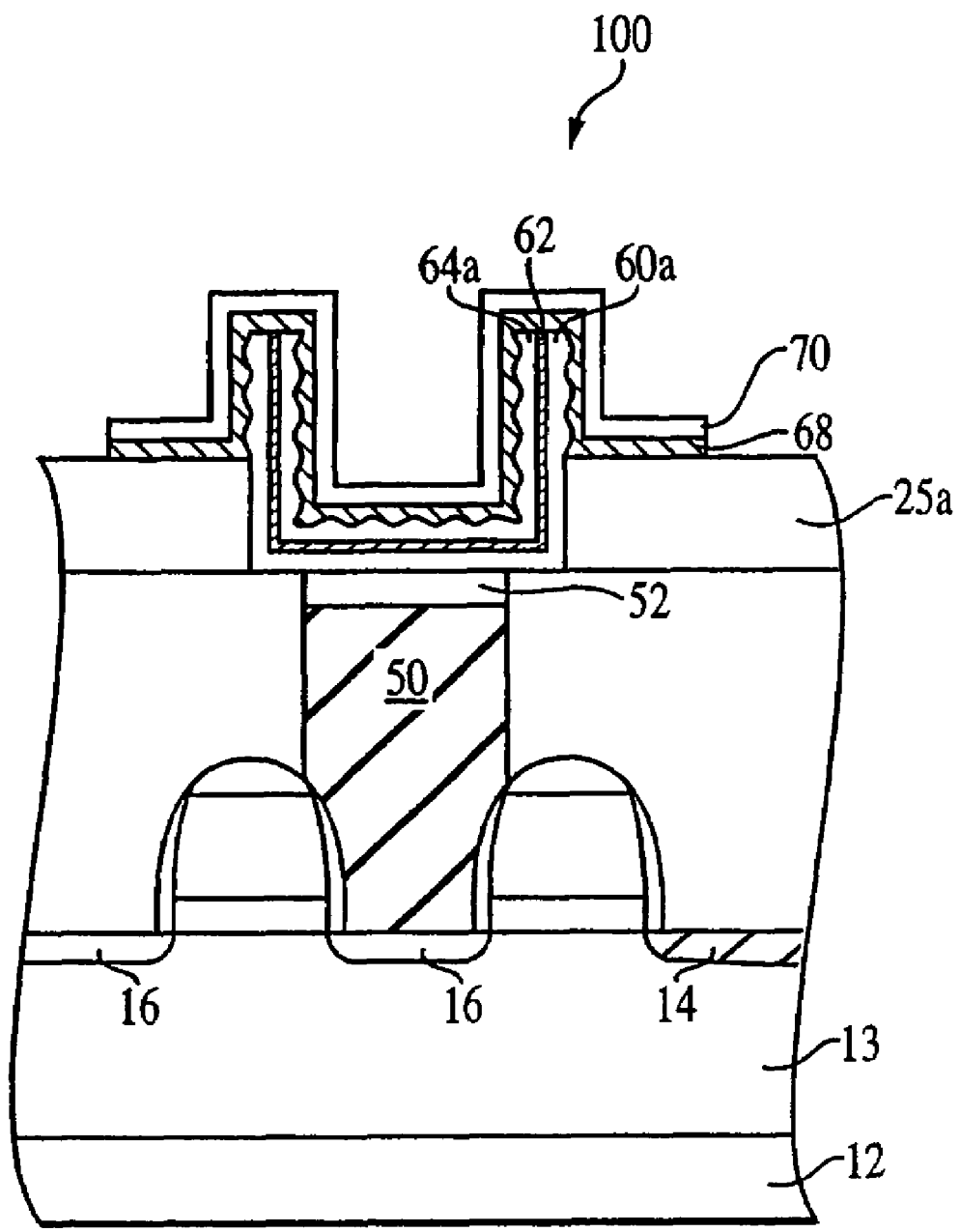
FIG. 17 is a schematic cross-sectional view of the FIG. 1 device at a stage of processing subsequent to that shown in FIG. 16.

FIG. 17 illustrates the dielectric layer 68 and the upper capacitor electrode 70 patterned by a dry etch to provide areas for additional contact plugs to be formed. The invention provides, therefore, a dual-sided HSG capacitor 100 having a lower capacitor electrode formed of a thin native oxide sandwiched between a doped polycrystalline layer and an HSG layer, which permits closer spacing of the capacitors in a memory array. Once the dual-sided HSG capacitors 100 of a array are formed, conventional processing techniques are employed to create a functional memory cell array using capacitors 100.

Figure 18:
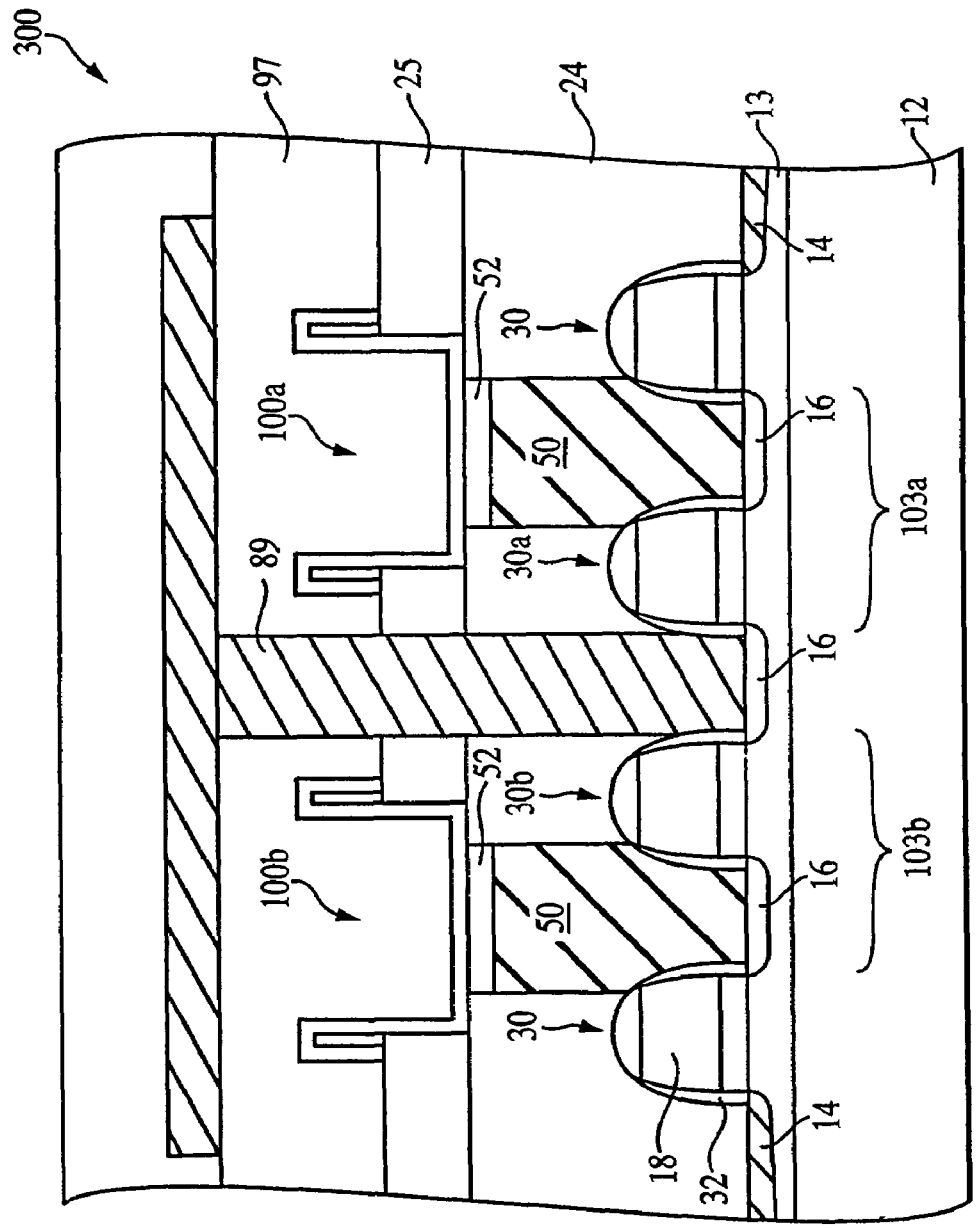
FIG. 18 is a schematic cross-sectional view of the FIG. 1 device at a stage of processing subsequent to that shown in FIG. 12.

The dual-sided HSG capacitor 100 (FIG. 17) may be used as a storage capacitor in a memory cell of a memory device such as a random access memory device. For example, FIG. 18 illustrates a portion of a memory array area of a DRAM memory device 300 formed in accordance with embodiments of the present invention. As illustrated in FIG. 18, the DRAM memory device 300 includes a pair of memory cells 103a, 103b comprising respective access transistors 30a, 30b having one source/drain region 16 connected to a respective dual-sided HSG capacitor 100a, 100b, formed according to the present invention. FIG. 18 also depicts a bit line conductor 89 formed over one or more insulating layers, such as insulating layer 97, and which is connected to the other source/drain region 16 of each of the access transistors 30a, 30b.

Figure 19:
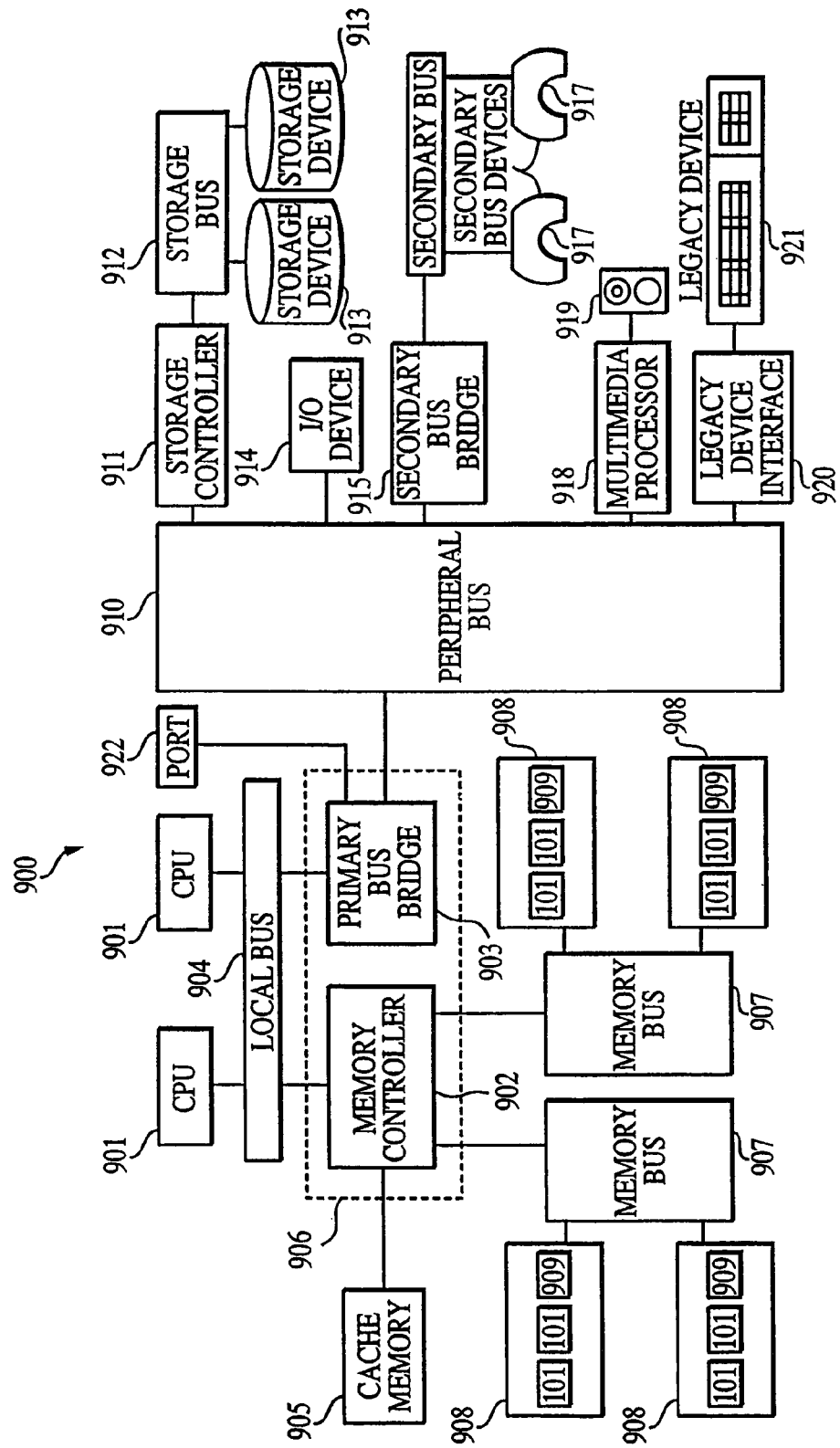
FIG. 19 is an illustration of a computer system having a memory device with a dual-sided HSG capacitor constructed in accordance with the present invention.

The DRAM memory device 300 (FIG. 18) may be used in a processing system such as the one illustrated in FIG. 19. The exemplary processing system 900 of FIG. 19 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908. The memory components 908 may be a memory card or a memory module and may include one or more memory devices 101 containing the dual-sided HSG capacitor 100 of the present invention. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 19 is only an exemplary processing system with which the invention may be used. While FIG. 19 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 having the memory device 101. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

Although the exemplary embodiments of the present invention have been described for the formation of only one dual-sided HSG capacitor 100 (FIG. 17), it must be understood that the present invention contemplates the formation of a plurality of such dual-sided capacitor devices.

The above description illustrates preferred embodiments that achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A memory device comprising:
    an array of memory cells, each memory cell of said array comprising a transistor and a capacitor, said capacitor comprising:
    a dual-sided electrode comprising an oxide layer between two conductive layers, the two conductive layers each having a first surface abutting the oxide layer and an opposing second surface;
    a dielectric layer in contact with the second surfaces of the two conductive layers of said dual-sided electrode; and
    a conductive layer over said dielectric layer.

2. The memory device of claim 1, wherein one of said two conductive layers is a doped polycrystalline layer in contact with said oxide layer.

3. The memory device of claim 2, wherein the other one of said two conductive layers is a layer of hemispherical grained polysilicon, said oxide layer being located between said doped polycrystalline layer and said layer of hemispherical grained polysilicon.

4. The memory device of claim 1, wherein said oxide layer is a native oxide layer.

5. The memory device of claim 4, wherein said native oxide layer has a thickness of about 5 Angstroms to about 50 Angstroms.

6. The memory device of claim 2, wherein said doped polycrystalline layer is formed of a material selected from the group consisting of hemispherical grained polysilicon, silicon, germanium, or any alloy of silicon and germanium.

7. The memory device of claim 1, wherein said dual-sided electrode is a lower electrode of said capacitor.

8. The memory device of claim 1, wherein said dual-sided electrode is an PH3 annealed dual-sided electrode.

9. The memory device of claim 1, wherein said oxide layer is an ALD oxide layer.

10. The memory device of claim 1, wherein said oxide layer is a thermally grown oxide layer.

11. A semiconductor device comprising:
    an electrical circuit formed over a semiconductor substrate, said electrical circuit comprising a capacitor, said capacitor further comprising a dual-sided capacitor electrode comprising:
    an annealed doped polycrystalline layer having HSG grains of a first thickness;
    a layer of hemispherical grained polysilicon having HSG grains of a second thickness; and
    an oxide layer between said annealed doped polycrystalline layer and said layer of hemispherical grained polysilicon.

12. The semiconductor device of claim 11 further comprising a dielectric layer in contact with at least one of said annealed doped polycrystalline layer and said layer of hemispherical grained polysilicon.

13. The semiconductor device of claim 12, wherein said oxide layer has a thickness of about 5 Angstroms to about 50 Angstroms.

14. The semiconductor device of claim 11, wherein said second thickness is greater than said first thickness.

15. The semiconductor device of claim 11, wherein said second thickness is of about 100 Angstroms to about 500 Angstroms.

16. The semiconductor device of claim 11, wherein said first thickness is of about 10 Angstroms to about 50 Angstroms.

17. The semiconductor device of claim 11, wherein said dual-sided electrode is a lower electrode of a capacitor.

18. A processor system comprising:
    a processor; and
    a memory coupled to said processor, at least one of said processor and said memory comprising a capacitor, said capacitor comprising:
    a dual-sided electrode comprising an oxide layer between and in contact with two different conductive layers, the two conductive layers each having a first surface abutting the oxide layer and an opposing second surface;
    a dielectric layer in contact with the second surfaces of the two conductive layers of said dual-sided electrode; and
    a conductive layer over said dielectric layer.

19. The processor system of claim 18, wherein said oxide layer is a native oxide layer having a thickness of about 5 Angstroms to about 50 Angstroms.

20. The processor system of claim 19, wherein said native oxide layer is formed between a doped polycrystalline layer and a layer of hemispherical grained polysilicon.

21. The processor system of claim 20, wherein said doped polycrystalline layer is formed of a material selected from the group consisting of hemispherical grained polysilicon, silicon, germanium, or any alloy of silicon and germanium.

22. The processor system of claim 18, wherein said dual-sided electrode is a lower electrode.

23. The processor system of claim 18, wherein the oxide layer is an ALD oxide layer.

24. The processor system of claim 18, wherein said oxide layer is a thermally grown oxide layer.

25. An electronic system comprising:
    at least one electrical circuit containing a capacitor, said capacitor comprising: a dual-sided electrode comprising an oxide layer between and in contact with two different conductive layers, the two conductive layers each having a first surface abutting the oxide layer and an opposing second surface;
    a dielectric layer in contact with the second surface of the two conductive layers of said dual-sided electrode; and
    a conductive layer over said dielectric layer.

26. The electronic system of claim 25, wherein one of said two conductive layers is a doped polycrystalline layer in contact with said oxide layer.

27. The electronic system of claim 26, wherein the other one of said two conductive layers is a layer of hemispherical grained polysilicon, said oxide layer being located between said doped polycrystalline layer and said layer of hemispherical grained polysilicon.

28. The electronic system of claim 25, wherein said oxide layer is a native oxide layer.

29. The electronic system of claim 28, wherein said native oxide layer has a thickness of about 5 Angstroms to about 50 Angstroms.

30. The electronic system of claim 25, wherein said dual-sided electrode is a lower electrode of said capacitor.

31. The electronic system of claim 25, wherein said dual-sided electrode is an PH3 annealed dual-sided electrode.

32. The electronic system of claim 25, wherein said oxide layer is an ALD oxide layer.

33. The electronic system of claim 25, wherein said oxide layer is a thermally grown oxide layer.

* * * * *

UNITED STATES PATENT AND TRADEMARK OFFICE
CERTIFICATE OF CORRECTION

PATENT NO. : 7,355,232 B2  Page 1 of 1
APPLICATION NO. : 11/218578
DATED : April 8, 2008
INVENTOR(S) : Ping et al.

It is certified that error appears in the above-identified patent and that said Letters Patent is hereby corrected as shown below:

On the face page, in field (60), under "Related U.S. Application Data", in column 1, line 6, delete "6,870,493." and insert -- 6,870,210. --, therefor.

In column 1, line 13, delete "6,870,493," and insert -- 6,870,210, --, therefor.

In column 11, line 42, in Claim 8, delete "PH3" and insert -- $PH_3$ --, therefor.

In column 12, line 60, in Claim 31, delete "PH3" and insert -- $PH_3$ --, therefor.

Signed and Sealed this

Twenty-fourth Day of June, 2008

JON W. DUDAS
*Director of the United States Patent and Trademark Office*